United States Patent
Rathburn

(10) Patent No.: US 10,453,789 B2
(45) Date of Patent: Oct. 22, 2019

(54) ELECTRODEPOSITED CONTACT TERMINAL FOR USE AS AN ELECTRICAL CONNECTOR OR SEMICONDUCTOR PACKAGING SUBSTRATE

(71) Applicant: HSIO Technologies, LLC, Maple Grove, MN (US)

(72) Inventor: James J. Rathburn, Maple Grove, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 246 days.

(21) Appl. No.: 15/698,271

(22) Filed: Sep. 7, 2017

(65) Prior Publication Data

US 2018/0012832 A1 Jan. 11, 2018

Related U.S. Application Data

(63) Continuation of application No. 15/062,137, filed on Mar. 6, 2016, now Pat. No. 9,761,520, and a
(Continued)

(51) Int. Cl.
*H01L 23/498* (2006.01)
*H01L 21/48* (2006.01)
(Continued)

(52) U.S. Cl.
CPC ...... *H01L 23/49861* (2013.01); *H01L 21/486* (2013.01); *H01L 23/49811* (2013.01);
(Continued)

(58) Field of Classification Search
CPC .............. H01L 23/49861; H01L 21/486; H01L 23/49827; H01L 23/49811; H01L 21/4853;
(Continued)

(56) References Cited

U.S. PATENT DOCUMENTS

| 3,672,986 A | 6/1972 | Schneble |
|---|---|---|
| 4,188,438 A | 2/1980 | Burns |

(Continued)

FOREIGN PATENT DOCUMENTS

| JP | 2003/217774 | 7/2003 |
|---|---|---|
| JP | 3274601 | 3/2009 |

(Continued)

OTHER PUBLICATIONS

Notification of Transmittal of the International Search Report and the Written Opinion of the International Searching Authority dated Jul. 30, 2010 in International Application No. PCT/US2010/036043.

(Continued)

*Primary Examiner* — Sherman Ng

(57) ABSTRACT

An electrical connectors with electrodeposited terminals that are grown in place by electroplating cavities formed in a series of resist layers. The resist layers are subsequently stripped away. The resulting terminal shape is defined by the shape of the cavity created in the resist layers. Complex terminal shapes are possible. The present conductive terminals are particularly useful for electrical interconnects and semiconductor packaging substrates.

20 Claims, 14 Drawing Sheets

Related U.S. Application Data continuation-in-part of application No. 14/408,039, filed as application No. PCT/US2013/030981 on Mar. 13, 2013, now Pat. No. 9,350,124.

(60) Provisional application No. 62/134,936, filed on Mar. 18, 2015, provisional application No. 61/669,893, filed on Jul. 10, 2012.

(51) Int. Cl.
  *H05K 3/32* (2006.01)
  *H05K 3/36* (2006.01)
  *H01R 12/52* (2011.01)

(52) U.S. Cl.
  CPC .... *H01L 23/49827* (2013.01); *H01L 21/4853* (2013.01); *H01L 2224/16145* (2013.01); *H01L 2224/16238* (2013.01); *H01R 12/52* (2013.01); *H05K 3/32* (2013.01); *H05K 3/368* (2013.01); *H05K 2201/10189* (2013.01); *H05K 2201/10734* (2013.01); *H05K 2201/10962* (2013.01)

(58) Field of Classification Search
  CPC ........... H01L 2224/16145; H01L 2224/16238; H01R 12/52; H05K 3/32; H05K 2201/10962; H05K 3/368; H05K 2201/10734; H05L 2201/10189
  USPC ........................................ 174/260
  See application file for complete search history.

(56) References Cited

U.S. PATENT DOCUMENTS

| | | |
|---|---|---|
| 4,295,700 A | 10/1981 | Sado |
| 4,489,999 A | 12/1984 | Miniet |
| 4,922,376 A | 5/1990 | Pommer et al. |
| 4,959,515 A | 9/1990 | Zavracky |
| 4,961,709 A * | 10/1990 | Noschese ........... H01R 13/2421 439/591 |
| 4,964,948 A | 10/1990 | Reed |
| 5,014,159 A | 5/1991 | Butt |
| 5,046,238 A | 9/1991 | Daigle |
| 5,071,363 A | 12/1991 | Reylek et al. |
| 5,072,520 A | 12/1991 | Nelson |
| 5,090,116 A | 2/1992 | Henschen |
| 5,096,426 A | 3/1992 | Simpson et al. |
| 5,127,837 A | 7/1992 | Shah et al. |
| 5,129,573 A | 7/1992 | Duffey |
| 5,161,983 A | 11/1992 | Ohno |
| 5,167,512 A | 12/1992 | Walkup |
| 5,208,068 A | 5/1993 | Davis et al. |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A | 10/1995 | Beilin et al. |
| 5,479,319 A | 12/1995 | Werther et al. |
| 5,509,019 A | 4/1996 | Yamamura |
| 5,527,998 A | 6/1996 | Anderson et al. |
| 5,534,787 A | 7/1996 | Levy |
| 5,562,462 A | 10/1996 | Matsuba et al. |
| 5,596,178 A | 1/1997 | Christian |
| 5,619,018 A | 4/1997 | Rossi |
| 5,659,181 A | 8/1997 | Bridenbaugh |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,764,485 A | 6/1998 | Lebaschi |
| 5,772,451 A | 6/1998 | Dozler et al. |
| 5,785,538 A | 7/1998 | Beaman et al. |
| 5,787,976 A | 8/1998 | Hamburgen et al. |
| 5,802,699 A | 9/1998 | Fjelstad et al. |
| 5,802,711 A | 9/1998 | Card et al. |
| 5,819,579 A | 10/1998 | Roberts |
| 5,880,590 A | 3/1999 | Desai et al. |
| 5,904,546 A | 5/1999 | Wood et al. |
| 5,913,109 A | 6/1999 | Distefano et al. |
| 5,921,786 A | 7/1999 | Slocum et al. |
| 5,925,931 A | 7/1999 | Yamamoto |
| 5,933,558 A | 8/1999 | Sauvageau et al. |
| 5,973,394 A | 10/1999 | Slocum et al. |
| 6,020,597 A | 2/2000 | Kwak |
| 6,062,879 A | 5/2000 | Beaman et al. |
| 6,080,932 A | 6/2000 | Smith et al. |
| 6,107,109 A | 8/2000 | Akram et al. |
| 6,114,240 A | 9/2000 | Akram et al. |
| 6,118,426 A | 9/2000 | Albert |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,288,451 B1 | 9/2001 | Tsao |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,428,328 B2 | 8/2002 | Haba et al. |
| 6,433,427 B1 | 8/2002 | Wu et al. |
| 6,436,802 B1 * | 8/2002 | Khoury ............. G01R 1/06738 257/E23.021 |
| 6,437,452 B2 | 8/2002 | Lin |
| 6,437,591 B1 | 8/2002 | Farnworth et al. |
| 6,459,418 B1 | 10/2002 | Comiskey |
| 6,461,183 B1 | 10/2002 | Ohkita |
| 6,462,418 B2 | 10/2002 | Sakamoto et al. |
| 6,462,568 B1 | 10/2002 | Cram |
| 6,477,286 B1 | 11/2002 | Ouchi |
| 6,490,786 B2 | 12/2002 | Belke et al. |
| 6,494,725 B2 | 12/2002 | Lin et al. |
| 6,506,438 B2 | 1/2003 | Duthaler et al. |
| 6,521,489 B2 | 2/2003 | Duthaler |
| 6,545,291 B1 | 4/2003 | Amundson |
| 6,572,396 B1 | 6/2003 | Rathburn |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |
| 6,750,473 B2 | 6/2004 | Amundson |
| 6,758,691 B1 | 7/2004 | McHugh |
| 6,765,288 B2 | 7/2004 | Damberg |
| 6,773,302 B2 | 8/2004 | Gutierrez et al. |
| 6,796,810 B2 | 9/2004 | DelPrete |
| 6,800,169 B2 | 10/2004 | Liu et al. |
| 6,809,414 B1 | 10/2004 | Lin et al. |
| 6,821,131 B2 | 11/2004 | Suzuki et al. |

(56) References Cited

U.S. PATENT DOCUMENTS

| | | |
|---|---|---|
| 6,823,124 B1 | 11/2004 | Renn |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,853,087 B2 | 2/2005 | Neuhasu et al. |
| 6,856,151 B1 | 2/2005 | Cram |
| 6,857,880 B2 | 2/2005 | Ohtsuki |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,974,332 B2 * | 12/2005 | Ma .................... H01R 13/2421 439/66 |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |
| 7,049,838 B2 | 5/2006 | Kagami |
| 7,064,412 B2 | 6/2006 | Geissinger et al. |
| 7,070,419 B2 | 7/2006 | Brown et al. |
| 7,095,090 B2 | 8/2006 | Nakajima et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,276,919 B1 | 10/2007 | Beaman et al. |
| 7,297,003 B2 | 11/2007 | Rathburn |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,393,214 B2 * | 7/2008 | DiStefano ........ H01R 13/2407 439/66 |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,535,114 B2 | 5/2009 | Agraharam et al. |
| 7,536,714 B2 | 5/2009 | Yuan |
| 7,537,461 B2 | 5/2009 | Rathburn |
| 7,538,415 B1 | 5/2009 | Lin et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,658,617 B1 | 2/2010 | Brodsky |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 | 1/2011 | Mizoguchi |
| 7,874,847 B2 | 1/2011 | Matsui et al. |
| 7,897,503 B2 | 3/2011 | Foster et al. |
| 7,898,087 B2 | 3/2011 | Chainer |
| 7,950,927 B2 | 5/2011 | Kazama |
| 7,955,088 B2 | 6/2011 | Di Stefano |
| 7,999,369 B2 | 8/2011 | Malhan et al. |
| 8,004,092 B2 | 8/2011 | Lin |
| 8,044,502 B2 | 10/2011 | Rathburn |
| 8,058,558 B2 | 11/2011 | Mok et al. |
| 8,072,058 B2 | 12/2011 | Kim et al. |
| 8,120,173 B2 | 2/2012 | Forman et al. |
| 8,144,687 B2 | 2/2012 | Mizoguchi |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,322 B1 | 9/2013 | Kim et al. |
| 8,525,346 B2 | 9/2013 | Rathburn |
| 8,536,714 B2 | 9/2013 | Sakagushi |
| 8,536,889 B2 | 9/2013 | Nelson et al. |
| 8,610,265 B2 | 12/2013 | Rathburn |
| 8,618,649 B2 | 12/2013 | Rathburn |
| 8,704,377 B2 | 4/2014 | Rathburn |
| 8,758,067 B2 | 6/2014 | Rathburn |
| 8,789,272 B2 | 7/2014 | Rathburn |
| 8,803,539 B2 | 8/2014 | Rathburn |
| 8,829,671 B2 | 9/2014 | Rathburn |
| 8,911,266 B2 | 12/2014 | Kawate |
| 8,912,812 B2 | 12/2014 | Rathburn |
| 8,928,344 B2 | 1/2015 | Rathburn |
| 8,955,215 B2 | 2/2015 | Rathburn |
| 8,955,216 B2 | 2/2015 | Rathburn |
| 8,970,031 B2 | 3/2015 | Rathburn |
| 8,981,568 B2 | 3/2015 | Rathburn |
| 8,981,809 B2 | 3/2015 | Rathburn |
| 8,984,748 B2 | 3/2015 | Rathburn |
| 8,987,886 B2 | 3/2015 | Rathburn |
| 8,988,093 B2 | 3/2015 | Rathburn |
| 9,054,097 B2 | 6/2015 | Rathburn |
| 9,076,884 B2 | 7/2015 | Rathburn |
| 9,093,767 B2 | 7/2015 | Rathburn |
| 9,136,196 B2 | 9/2015 | Rathburn |
| 9,184,145 B2 | 11/2015 | Rathburn |
| 9,184,527 B2 | 11/2015 | Rathburn |
| 9,196,980 B2 | 11/2015 | Rathburn |
| 9,231,328 B2 | 1/2016 | Rathburn |
| 9,232,654 B2 | 1/2016 | Rathburn |
| 9,276,336 B2 | 3/2016 | Rathburn |
| 9,276,339 B2 | 3/2016 | Rathburn |

(56) References Cited

U.S. PATENT DOCUMENTS

| | | |
|---|---|---|
| 9,277,654 B2 | 3/2016 | Rathburn |
| 9,318,862 B2 | 4/2016 | Rathburn |
| 9,320,133 B2 | 4/2016 | Rathburn |
| 9,320,144 B2 | 4/2016 | Rathburn |
| 9,350,093 B2 | 4/2016 | Rathburn |
| 9,350,214 B2 | 5/2016 | Rathburn |
| 9,414,500 B2 | 8/2016 | Rathburn |
| 9,559,447 B2 | 1/2017 | Rathburn |
| 9,689,897 B2 | 6/2017 | Rathburn |
| 9,755,335 B2 | 9/2017 | Rathburn |
| 9,761,520 B2 | 9/2017 | Rathburn |
| 2001/0012707 A1 | 8/2001 | Ho et al. |
| 2001/0016551 A1 | 8/2001 | Yishio et al. |
| 2002/0011639 A1 | 1/2002 | Carlson et al. |
| 2002/0027441 A1 | 3/2002 | Akrma et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2002/0179334 A1 | 12/2002 | Curcio |
| 2003/0003779 A1 | 1/2003 | Rathburn |
| 2003/0096512 A1 | 5/2003 | Cornell |
| 2003/0114029 A1 | 6/2003 | Lee et al. |
| 2003/0117161 A1 | 6/2003 | Burns |
| 2003/0141884 A1 | 7/2003 | Maruyama et al. |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0026465 A1* | 2/2005 | Frutschy ............ H05K 7/1061 439/74 |
| 2005/0048680 A1 | 3/2005 | Matsumani |
| 2005/0100294 A1 | 5/2005 | Nguyen et al. |
| 2005/0101164 A1 | 5/2005 | Rathburn |
| 2005/0162176 A1 | 7/2005 | Bucksch |
| 2005/0164527 A1 | 7/2005 | Radza et al. |
| 2005/0196511 A1 | 9/2005 | Garrity et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Andersen |
| 2006/0087064 A1 | 4/2006 | Daniel et al. |
| 2006/0125500 A1 | 6/2006 | Watkins et al. |
| 2006/0145338 A1 | 7/2006 | Dong |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0265919 A1 | 10/2006 | Huang |
| 2006/0258912 A1 | 11/2006 | Belson et al. |
| 2006/0261827 A1 | 11/2006 | Cooper et al. |
| 2006/0274510 A1 | 12/2006 | Nakada |
| 2006/0281303 A1 | 12/2006 | Trezza et al. |
| 2007/0021002 A1 | 1/2007 | Laurx et al. |
| 2007/0035030 A1 | 2/2007 | Horton |
| 2007/0057382 A1 | 3/2007 | Liu et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0269999 A1 | 11/2007 | Di Stefano |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0020624 A1* | 1/2008 | Nikaido ............ H05K 3/326 439/342 |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0117606 A1 | 5/2008 | Karlsson |
| 2008/0143358 A1 | 6/2008 | Breinlinger |
| 2008/0143367 A1 | 6/2008 | Chabineau-Lovgren |
| 2008/0156856 A1 | 7/2008 | Barausky et al. |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0039496 A1 | 2/2009 | Beer et al. |
| 2009/0047808 A1 | 2/2009 | Ma |
| 2009/0058444 A1 | 3/2009 | McIntyre |
| 2009/0061089 A1 | 3/2009 | King |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |
| 2010/0087075 A1* | 4/2010 | Kazama ............ G01R 1/0466 439/85 |
| 2010/0133680 A1 | 6/2010 | Kang et al. |
| 2010/0143194 A1 | 6/2010 | Lee et al. |
| 2010/0167559 A1* | 7/2010 | Cavegn ............ H05K 7/1069 439/65 |
| 2010/0188112 A1 | 7/2010 | Yoshida |
| 2010/0213960 A1 | 8/2010 | Mok et al. |
| 2010/0244872 A1 | 9/2010 | Yoshida |
| 2010/0290501 A1 | 11/2010 | De Bruyker |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |

(56) References Cited

U.S. PATENT DOCUMENTS

| | | |
|---|---|---|
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0002285 A1 | 1/2013 | Nelson |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0283922 A1 | 10/2013 | Qualtieri |
| 2013/0330942 A1 | 12/2013 | Rathburn |
| 2014/0043782 A1 | 2/2014 | Rathburn |
| 2014/0045350 A1 | 2/2014 | Taylor |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |
| 2014/0273641 A1 | 9/2014 | Light |
| 2015/0013901 A1 | 1/2015 | Rathburn |
| 2015/0091600 A1 | 4/2015 | Rathburn |
| 2015/0136467 A1 | 5/2015 | Rathburn |
| 2015/0162678 A1 | 6/2015 | Rathburn |
| 2015/0181810 A1 | 6/2015 | Rathburn |
| 2016/0014908 A1 | 1/2016 | Rathburn |

FOREIGN PATENT DOCUMENTS

| | | |
|---|---|---|
| WO | WO 1991/014015 | 9/1991 |
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO 2014/011226 | 1/2014 |
| WO | WO 2014/011228 | 1/2014 |
| WO | WO 2014/011232 | 1/2014 |
| WO | WO 2015/006393 | 1/2015 |

OTHER PUBLICATIONS

Notification of Transmittal of the International Search Report and the Written Opinion of the International Searching Authority dated Jul. 21, 2010 in International Application No. PCT/US2010/036047.

Notification of Transmittal of the International Search Report and the Written Opinion of the International Searching Authority dated Jul. 28, 2010 in International Application No. PCT/US2010/036363.

Notification of Transmittal of the International Search Report and the Written Opinion of the International Searching Authority dated Jul. 28, 2010 in International Application No. PCT/US2010/036377.

Notification of Transmittal of the International Search Report and the Written Opinion of the International Searching Authority dated Jul. 30, 2010 in International Application No. PCT/US2010/036388.

Notification of Transmittal of the International Search Report and the Written Opinion of the International Searching Authority dated Jul. 27, 2010 in International Application No. PCT/US2010/036397.

Notification of Transmittal of the International Search Report and the Written Opinion of the International Searching Authority dated Jul. 30, 2010 in International Application No. PCT/US2010/036055.

Notification of Transmittal of the International Search Report and the Written Opinion of the International Searching Authority dated Aug. 4, 2010 in International Application No. PCT/US2010/036288.

Notification of Transmittal of the International Search Report and the Written Opinion of the International Searching Authority dated Aug. 4, 2010 in International Application No. PCT/US2010/036285.

Notification of Transmittal of the International Search Report and the Written Opinion of the International Searching Authority dated Jul. 30, 2010 in International Application No. PCT/US2010/036282.

Notification of Transmittal of the International Search Report and the Written Opinion of the International Searching Authority dated Jul. 30, 2010 in International Application No. PCT/US2010/036295.

Notification of Transmittal of the International Search Report and the Written Opinion of the International Searching Authority dated Jul. 30, 2010 in International Application No. PCT/US2010/036313.

Notification of Transmittal of the International Search Report and the Written Opinion of the International Searching Authority dated Aug. 3, 2010 in International Application No. PCT/US2010/037619.

Notification of Transmittal of the International Search Report and the Written Opinion of the International Searching Authority dated Sep. 7, 2010 in International Application No. PCT/US2010/038600.

Notification of Transmittal of the International Search Report and the Written Opinion of the International Searching Authority dated Aug. 18, 2010 in International Application No. PCT/US2010/038606.

Notification of Transmittal of the International Search Report and the Written Opinion of the International Searching Authority dated Sep. 1, 2010 in International Application No. PCT/US2010/040188.

Notification of Transmittal of the International Search Report and the Written Opinion of the International Searching Authority dated Aug. 20, 2010 in International Application No. PCT/US2010/040197.

Notification of Transmittal of the International Search Report and the Written Opinion of the International Searching Authority dated Apr. 14, 2011 in International Application No. PCT/US2011/023138.

(56) References Cited

OTHER PUBLICATIONS

Notification of Transmittal of the International Search Report and the Written Opinion of the International Searching Authority dated Aug. 17, 2011 in International Application No. PCT/US2011/033726.
Notification of Transmittal of the International Search Report and the Written Opinion of the International Searching Authority dated Sep. 27, 2011 in International Application No. PCT/US2011/038845.
Notification of Transmittal of the International Search Report and the Written Opinion of the International Searching Authority dated Feb. 8, 2012 in International Application No. PCT/US2011/056664.
Notification of Transmittal of the International Search Report and the Written Opinion of the International Searching Authority dated Mar. 26, 2012 in International Application No. PCT/US2011/062313.
Notification of Transmittal of the International Search Report and the Written Opinion of the International Searching Authority dated Jun. 20, 2012 in International Application No. PCT/US2012/027813.
Notification of Transmittal of the International Search Report and the Written Opinion of the International Searching Authority dated Jun. 19, 2012 in International Application No. PCT/US2012/027823.
Notification of Transmittal of the International Search Report and the Written Opinion of the International Searching Authority dated Nov. 29, 2012 in International Application No. PCT/US2012/053848.
Notification of Transmittal of the International Search Report and the Written Opinion of the International Searching Authority dated Jun. 3, 2013 in International Application No. PCT/US2013/031395.
Notification of Transmittal of the International Search Report and the Written Opinion of the International Searching Authority dated Jun. 19, 2013 in International Application No. PCT/US2013/030981.
Notification of Transmittal of the International Search Report and the Written Opinion of the International Searching Authority dated Jun. 7, 2013 in International Application No. PCT/US2013/030856.
Notification of Transmittal of the International Search Report and the Written Opinion of the International Searching Authority dated Oct. 27, 2014 in International Application No. PCT/US2014/045856.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Liu, et al, "All-Polymer Capacitor Fabricated With Inkjet Printing Technique," Solid-State Electronics, vol. 47, pp. 1543-1548 (2003).
Print—Definition of Print by The Free Dictionary, http://www.thefreedictionary.com/print. Aug. 13, 2014.
European Search Report for EP 16 16 2703 A3 dated Sep. 9, 2016.
European Search Report for EP 14 82 2548 dated Nov. 2, 2016.

\* cited by examiner

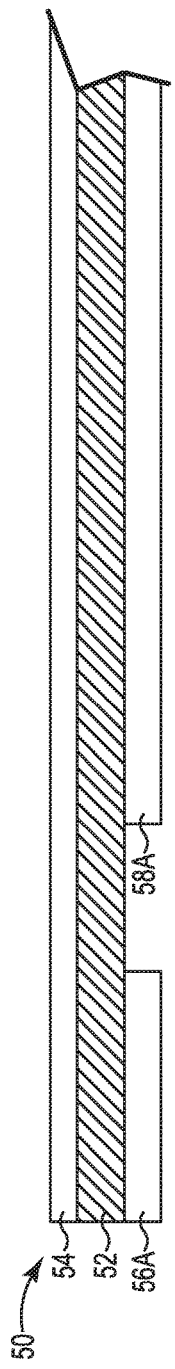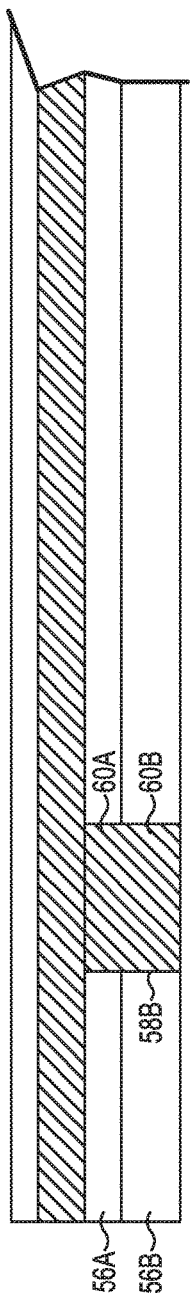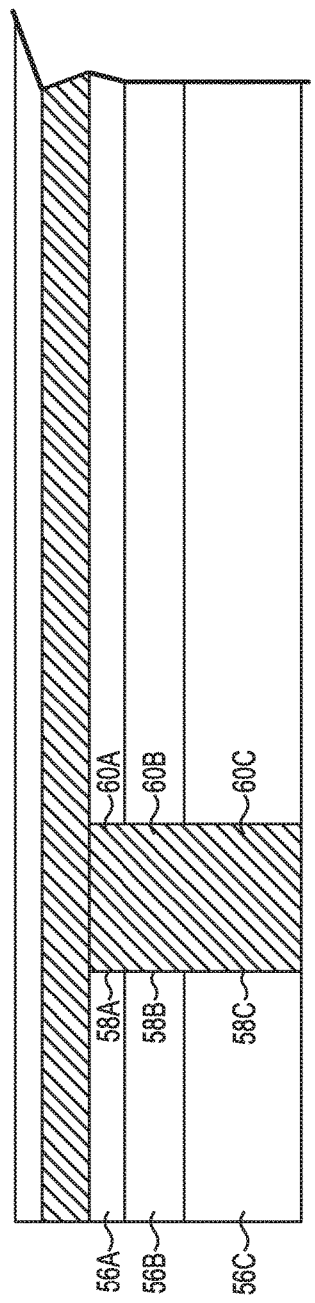

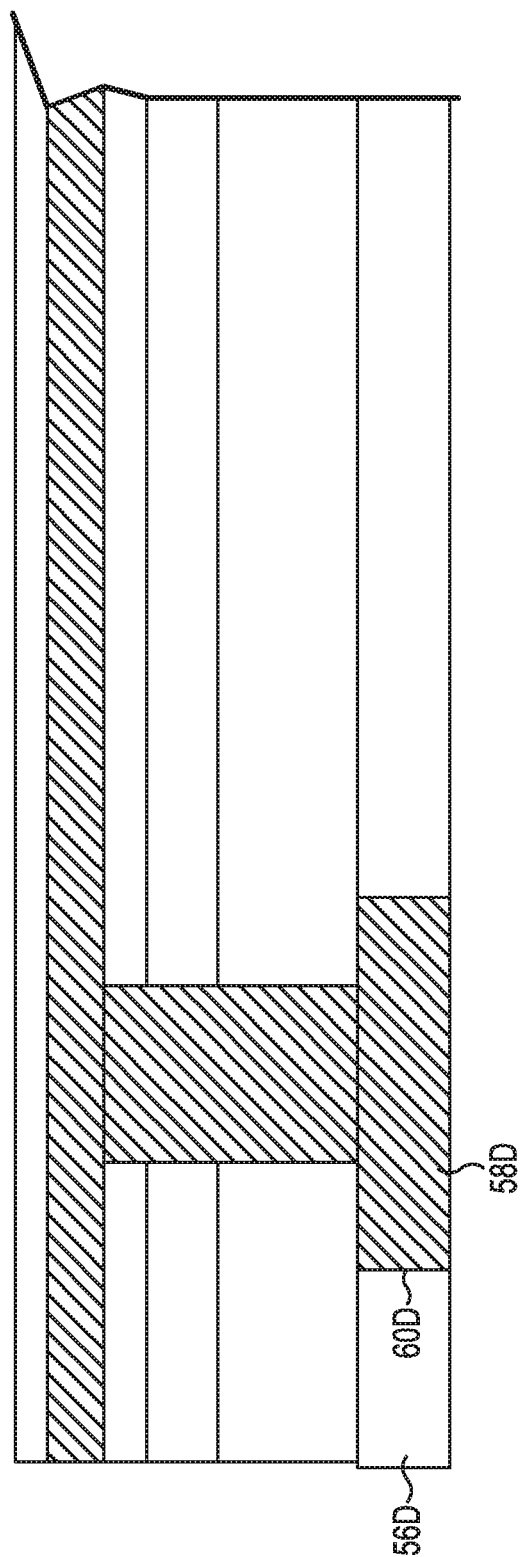

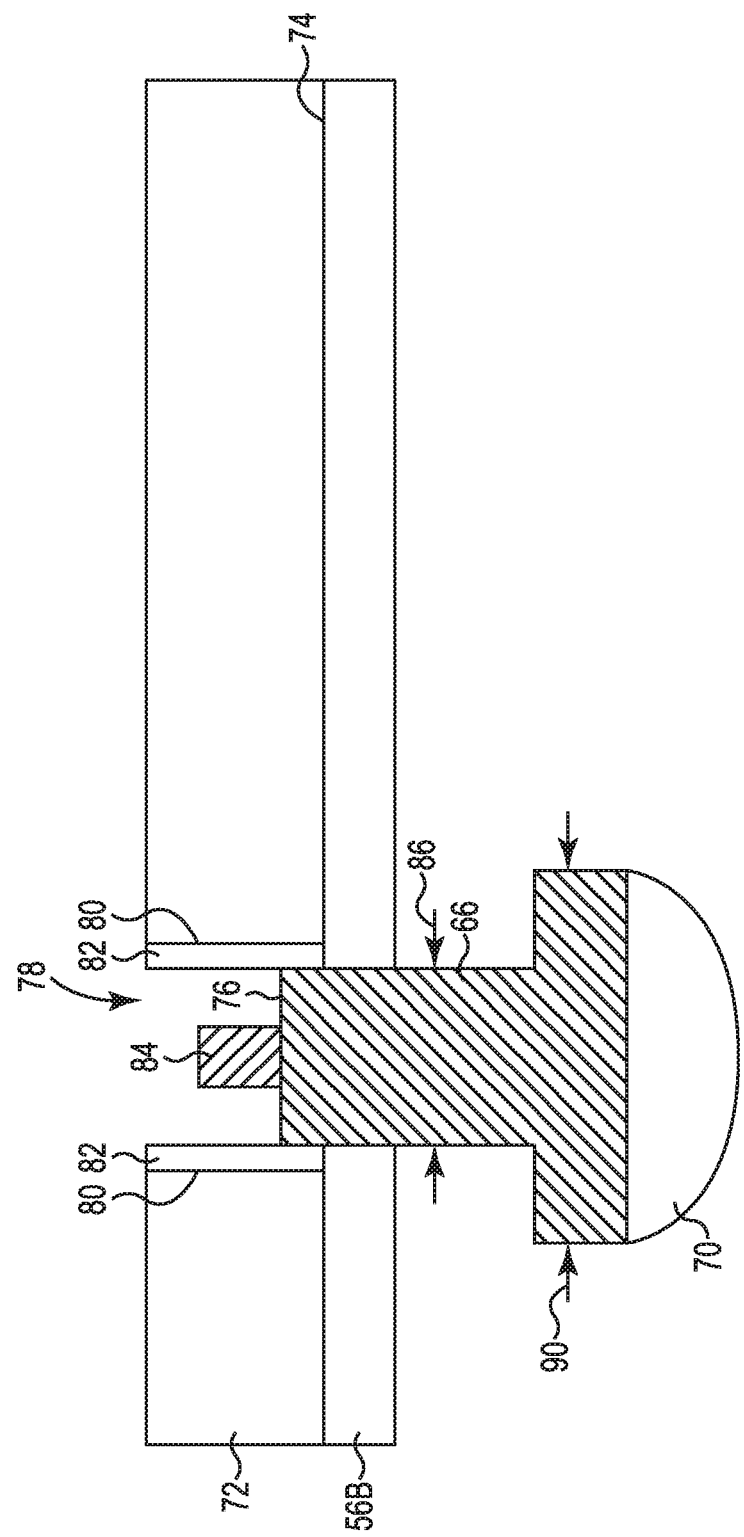

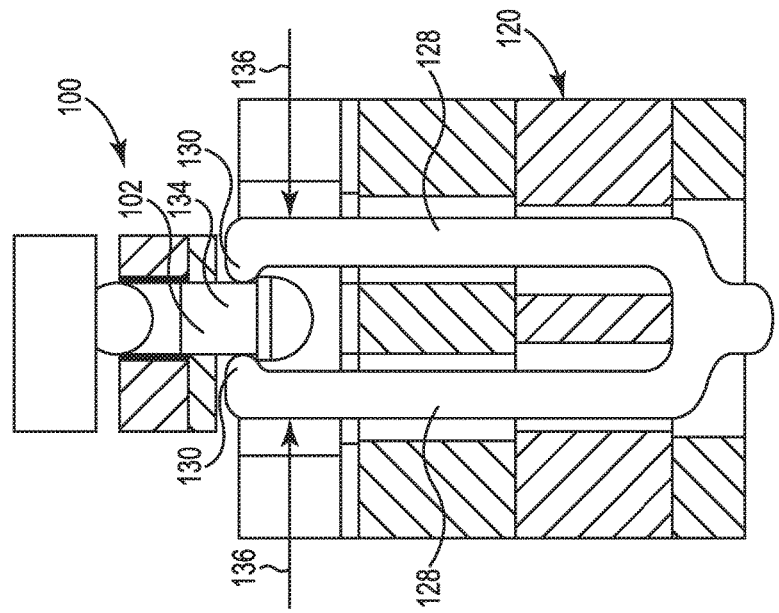
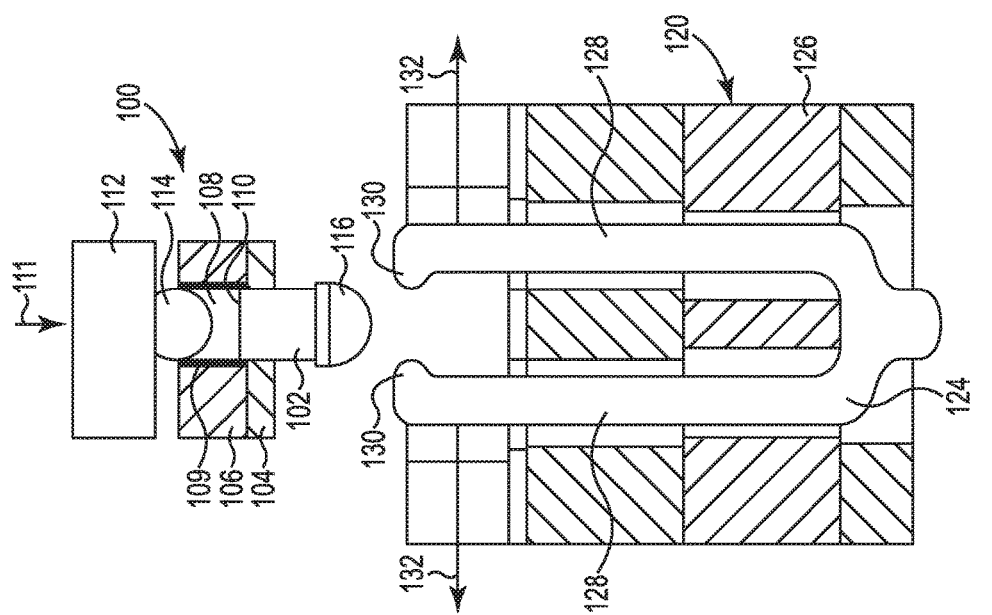
Fig. 2B
Fig. 2A

ELECTRODEPOSITED CONTACT TERMINAL FOR USE AS AN ELECTRICAL CONNECTOR OR SEMICONDUCTOR PACKAGING SUBSTRATE

CROSS-REFERENCE TO RELATED APPLICATIONS

The present application is a continuation of U.S. Ser. No. 15/062,137 (U.S. Pat. No. 9,761,520), filed Mar. 6, 2016 (Issued Sep. 12, 2017), entitled Electrodeposited Contact Terminal for Use as an Electrical Connector or Semiconductor Packaging Substrate, which claims the benefit of U.S. provisional application 62/134,936, filed Mar. 18, 2015, entitled Electrodeposited Contact Terminal for Use as an Electrical Connector or Semiconductor Packaging Substrate, the entire disclosure of which is hereby incorporated by reference.

This application is a continuation-in-part of U.S. patent Ser. No. 14/408,039, filed Dec. 15, 2014, entitled HIGH SPEED CIRCUIT ASSEMBLY WITH INTEGRAL TERMINAL AND MATING BIAS LOADING ELECTRICAL CONNECTOR ASSEMBLY, which is a national stage application under 35 U.S.C. 371 of International Application No. PCT/US2013/30981, filed Mar. 13, 2013, which claims the benefit of U.S. Provisional Application No. 61/669,893, filed Jul. 10, 2012, the disclosure of which is hereby incorporated by reference.

TECHNICAL FIELD

The present disclosure relates to electrical connectors with electrodeposited terminals that are grown in place by electroplating cavities formed in a series of resist layers. The resist layers are subsequently stripped away. Complex terminal shapes are possible because the resulting terminal shape is defined by the shape of the cavity created in the resist layers. The present electrical connectors are particularly useful for electrical interconnects and semiconductor packaging substrates.

BACKGROUND OF THE INVENTION

Electrical interconnects and package substrates experience challenges as the feature sizes and line spacing are reduced to achieve further miniaturization and increased circuit density. The use of laser ablation has become increasingly used to create the via structures for fine line or fine pitch structures. The use of lasers allows localized structure creation, where the processed circuits are plated together to create via connections from one layer to another. As density increases, however, laser processed via structures can experience significant taper, carbon contamination, layer-to-layer shorting during the plating process due to registration issues, and high resistance interconnections that may be prone to result in reliability issues. The challenge of making fine line PCBs often relates to the difficulty in creating very small or blind and buried vias.

The process used by current technology is based upon a dry film process, where a substrate of some sort has a copper layer as the base circuit layer onto which a dry film is applied. The dry film is then patterned with a laser to create the circuit patterns. The next copper layer is added and etched as appropriate, with the laser used to drill through the film to expose the previous copper layer so a via can be plated to join the circuit layers. This process is typically used for semiconductor package substrates and larger format circuit boards, such as used in a cell phone. For larger format circuit boards, the dry film technology is used to build fine line circuits on top of base circuit board made with conventional low density lamination techniques.

In both cases, the package substrate and the larger format circuit board build up are very expensive compared to traditional low density laminate technology, and suffer from several limitations inherent to the process. For example, in the case where a low density laminate base is used as the starting point for subsequent high density layers are built up, the cost increases dramatically since the entire surface of the lower density base board must be processed with the build up process across the entire area, not just in the areas where the high density is required.

Another limitation is the reliability of the via structures joining one circuit layer to another, which tend to be a barrel plated structures with the side walls of the via plated and in many cases must be filled with a via fill material to eliminate an air pocket which may separate during solder reflow temperatures. The vias require drilling through the dry film to expose the previous circuit layer in order to create the via that connects the circuit layers. The dry film is applied as a solid contiguous sheet where the material on that particular layer is restricted to that particular material across the entire layer in the build up less the areas ablated to create the via target for joining the previous and subsequent circuit layers. That is, the dry layer film is homogeneous across the entire layer.

BRIEF SUMMARY OF THE INVENTION

The present disclosure relates electrical connectors with resist defined electrodeposited terminals. The terminal shape is defined by the shape of the cavity created in the resist layers, so complex terminal shapes are possible. The present electrical connectors are particularly useful for electrical interconnects and semiconductor packaging substrates.

One embodiment is directed to a method of making an electrical connector with electrodeposited terminals. The method includes preparing a substrate with a plurality of openings corresponding to a desired arrangement of the electrodeposited terminals. A first resist layer is deposited on a first surface of the substrate with a plurality of first through holes aligned with the openings in the substrate. The first through holes are electroplated so that the holes and at least a portion of the openings in the substrate are substantially filled with a conductive material. A second resist layer is deposited on the first resist layer to create a plurality of second through holes having second cross-sectional shapes that at least partially overlap with the conductive material in the first through holes. The second cross-sectional shapes of the second through holes preferably extend beyond the first cross-sectional shapes. The second through holes are electroplated so the second through holes are substantially filled with a conductive material. The first and second resist layers are removed to expose electrodeposited terminals attached to the substrate. The electrodeposited terminals have neck portions corresponding to the first cross-sectional shapes of the first through holes and distal portions corresponding to the second cross-sectional shapes of the second through holes. The distal portions and at least a portion of the neck portions extend above the first surface of the substrate and the distal portions include cantilevered portions that extend beyond the neck portions. A dielectric material is optionally deposited on a second surface of the substrate with terminal openings aligned with proximal portions of the electrodeposited terminals.

One embodiment includes positioning electrical terminals of a circuit member in the terminal openings in the substrate so the electrical terminals are electrically coupled with the proximal portions of the electrodeposited terminals. In another embodiment, the terminal openings are plated and the method includes plastically deforming at least one of the solder terminals on the BGA device or the plating in the terminal openings to electrically couple the solder terminals to the electrodeposited terminals. One embodiment includes positioning solder terminals on a BGA device in the terminal openings in the substrate and reflowing the solder terminals to electrically couple the solder terminals on the BGA device to the electrodeposited terminals. It is also possible to omit the dielectric material on the second surface of the substrate and directly couple a flexible circuit member to proximal portions of the electroplated terminals.

In another embodiment a third resist layer is deposited on the second resist layer to create a plurality of third through holes having third cross-sectional shapes that at least partially overlap with the conductive material in the second through holes. The second and third through holes are preferably configured so the electrodeposited terminals have two cantilevered portions extending in different directions relative to the neck portion. The present method can also be used to create conductive extensions on proximal ends of the electrodeposited terminals that extend upward in the terminal openings.

The present electrodeposited terminals may include undercuts that facilitates electrical and mechanical coupling with spring contact members. The distal ends of the electrodeposited flex the spring contact members to create a compression or snap-fit engagement. In one embodiment, protrusions on the spring contact members engage with the neck portions and are captured against the distal ends of the electrodeposited terminals. The spring contact members preferably include opposing beams with opposing protrusions that mechanically retain the electrical connector to the interconnect. The neck portions can optionally include features, such as a recess, to engage with the protrusions.

The present disclosure is also directed to an electrical assembly that includes an electrical connector having a substrate with a plurality of electrodeposited terminals. The electrodeposited terminals include neck portions with a first cross-sectional shape and distal portions having a second cross-sectional shape larger than the first cross sectional shape. The distal portions and at least a portion of the neck portions extend above the first surface of the substrate and the distal portions include cantilevered portions that extend beyond the neck portions. A dielectric material is located on a second surface of the substrate with terminal openings aligned with proximal portions of the electrodeposited terminals. A first circuit member includes raised electrical terminals positioned in the terminal openings and electrically coupled to the proximal portions of the electrodeposited terminals. A second circuit member is electrically coupled to the distal ends of the electrodeposited terminals.

In one embodiment, inside surfaces of the terminal openings are plated and the first circuit member comprises a BGA device with solder terminals electrically coupled with the plating in the terminal openings. In another embodiment, the distal portions of the electroplated terminals include two cantilevered portions that extend beyond the neck portions in different directions relative to the neck portion. The second circuit member is optionally an electrical interconnect having spring contact members located in openings. The spring contacts include protrusions that form a snap-fit engagement with the neck portions of the electrodeposited terminals.

The present disclosure is also directed to a method of coupling a flexible circuit with the extensions on the electrodeposited terminals located along the second surface of the substrate. The extensions are positioned in openings in a flexible circuits and electrically couple with circuit traces in the flexible circuit.

BRIEF DESCRIPTION OF THE SEVERAL VIEWS OF THE DRAWING

FIGS. 1A through 1G illustrate various method of making an electrical connector with resist defined electroplated terminals in accordance with an embodiment of the present disclosure.

FIGS. 2A and 2B are side views of an electrical interconnect with electroplated terminals coupled to a BGA device in accordance with an embodiment of the present disclosure.

DETAILED DESCRIPTION OF THE INVENTION

Figure 1E:
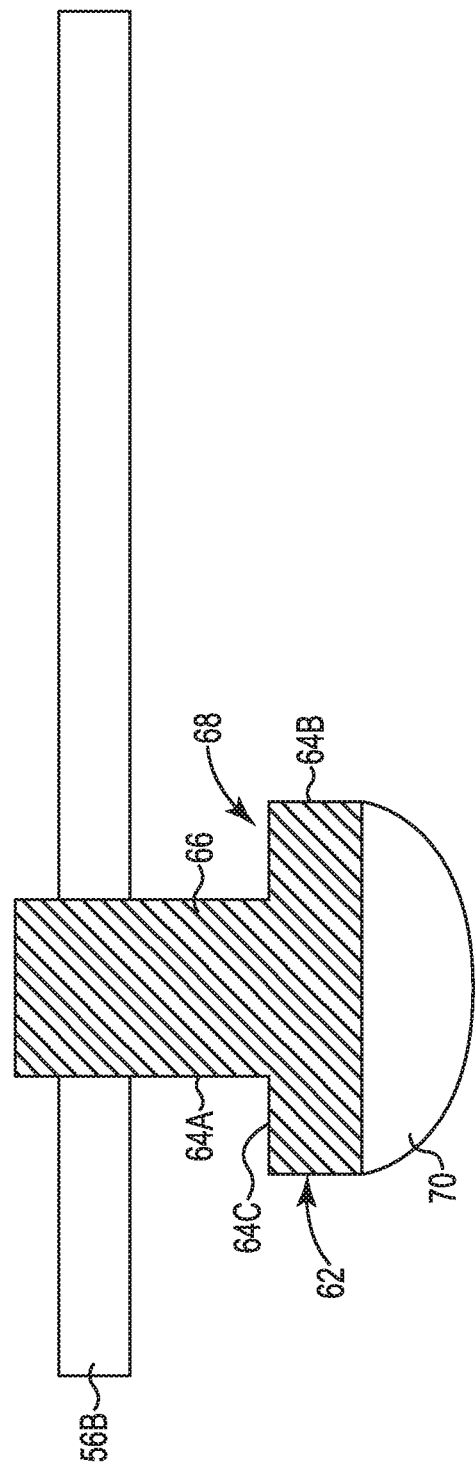

FIGS. 1A-1E illustrate a method of making an electrical connector 50 with resist defined electroplated terminals 62 in accordance with an embodiment of the present disclosure. In the illustrated embodiment, temporary copper bus 52 is deposited on substrate 54. Resist layer 56A is deposited on the copper bus 52 with through holes 58A into which the resist defined electroplated terminals will be formed. The copper bus 52 enhances bulk copper electro plating. In one embodiment, the copper bus 52 is subsequently removed with a differential etch process that leaves terminals 62 intact (see e.g., FIG. 1E).

As best illustrated in FIGS. 1A through 1C, one or more resist layers 56A, 56B, 56C ("56") of an imageable or ablateable plating resist are deposited on the copper bus 52 with through holes or recesses 58A, 58B, 58C ("58") that define the shape of the electroplated terminals 62. The through holes 58 can have the same or a different cross-sectional shape (see e.g., FIGS. 1G, 4A and 4B). Any cross-sectional shape is possible, including round, square, triangular, irregular or random, and the like, and the cross-sectional shape can vary from layer-to-layers 56.

In the preferred embodiment, plating 60A is deposited in through holes 58A, before resist layer 56B is deposited. Resist layer 56B is then deposited, followed sequentially by plating 60B, resist layer 56C and plating 60C. This sequential process minimizes the risk of plating defects, such as voids. In an alternate embodiment, multiple layers 56 can be deposited before the plating 60. In the preferred embodiment, the resist 56 is a liquid material that is imaged to create the through holes 58. One or more of the resist layers 56 are optionally planarized to create a very consistent dielectric thickness and planarity, as well as assist with preparing select surfaces for electro-less copper plating adhesion.

In an alternate embodiment, layer 56B is constructed from a different dielectric material, such as for example, a liquid crystal polymer. In one embodiment, the layer 56B is a sheet of LCP with a series of through holes 58B corresponding to the desired arrangement of the electrodeposited terminals. Resist layer 56A is added and imaged to create the through holes 58A, followed by a plating step to add electrical bus 52. The remainder of the process is as discussed herein. When the resist layers 56A, 56C, and 56D are removed, all that remains are the terminals 62 and the core layer 56B.

The present method permits the material between the resist layers 56 and within each layer to be varied. One aspect of the present process that differs from the traditional dry film build up process is the nature of the dielectric deposition in liquid form. The resist layers 56 can be applied by screen printing, stencil printing, jetting, flooding, spraying etc. The liquid material 56 flows and fills any recessed regions within a previous circuit landscape. During the development process, desired regions remain and the regions that are not desired are washed away with fine resolution of the transition regions within the landscape. Multiple depositions steps can be tack cured and imaged such that thicker sections of resist layers 56 can be developed and washed away in one or multiple strip operations. As a result, internal cavities or mass regions can be excavated and subsequently filled at the next dielectric layer with materials that have physical properties differing from the base resist layer 56. In other words, the excavated regions can be filled or treated with materials that have a different dielectric constant, vary in conductive or mechanical or thermal properties to achieve a desired performance function not possible with a contiguous dry film technique. In basic terms, the present process not only provides the ability to alter the material set and associated properties in a given layer, but the material set can be altered at any given point within a given deposition or layer.

As illustrated in FIG. 1D, final resist layer 56D is applied with through holes 58D having cross-sectional shapes different than the cross-sectional shapes of at least the through holes 58C. In the illustrated embodiment, the cross-sectional shapes of the through holes 58D extends beyond entire cross-sectional shapes of the through holes 58C, creating circumferential undercuts 68. The through holes 58D are then plated.

Upon reaching the desired terminal formation some or all of the resist layers are stripped. In the embodiment of FIG. 1E, the resist layers 56A, 56C and 56D are removed to exposed the free standing electroplated terminals 62 is exposed. Layer 56B acts as the core support for the terminals 62. The temporary copper bus 52 and substrate 54 are also preferably removed. In the illustrated embodiment, the terminals 62 include a plurality of contact surfaces or facets 64A, 64B, 64C ("64") that can potentially electrically and mechanically couple with another circuit member. Neck portions 66 provide undercuts 68 that cannot be formed using dry film technology. An optional domed or radius edge 70 can be added to the terminal 62 either by plating or solder deposition.

Multiple layers of resist 56 can be built up and a variety of terminal shapes can be created as a function of the resist thickness and the shape of the target opening where plating is deposited to the previous target layer while not depositing onto the resist. The terminals 62 can be a variety of shapes, such as for example, cylindrical or non-cylindrical, regular or irregular, symmetrical or asymmetrical, rectangular, curvilinear, and the like. For example, the neck portion 66 can optionally be formed with features, such as the recesses illustrated in FIGS. 4A and 4B. The resist layers 56 also permit the creation of internal features, undercuts, or cavities that are difficult or typically not possible to make using conventional molding or machining techniques, referred to herein as a "non-moldable feature."

While a single terminal is shown in FIG. 1E, fields of terminals 62 in mass quantities can be created simultaneously and mass plated with final finish as desired. For some applications such as with a semiconductor package, rigid or flex circuit that may benefit from a solder terminal either for final reflow or temporary connection, the terminal 62 can be constructed of solder.

As illustrated in FIG. 1F, dielectric layer 72 is be added to second surface 74 of the layer 56B. In one embodiment, the dielectric layer 72 is a liquid crystal polymer material processed to create through holes 78. Use of liquid crystal polymers in electrical connectors is disclosed in commonly assigned U.S. patent application Ser. No. 14/864,215, filed Sep. 24, 2015, entitled Fusion Bonded Liquid Crystal Polymer Circuit Structure, which is hereby incorporated by reference.

The second surface 76 of the terminal 62 is exposed in recess 78 in the dielectric layer 72. Sidewalls 80 of the recess 76 optionally include plating 82. In one embodiment, optional conductive extension 84 is formed on the rear surface 76 of the terminal 62 using the resist/plating processes discussed herein.

The dielectric layer 72 is optionally processed to enable electro-less or electrolytic copper plating to adhere to the sidewalls 80, such as one or more of plasma treatment, permanganate, carbon treatment, impregnating copper nanoparticles, and the like. Once the surfaces 80 are plated, a higher deposition rate electroplate copper can be applied to build up the thickness or area of copper as desired. Additional discussion of electro-less plating of the dielectric structure is disclosed in commonly assigned U.S. patent Ser. No. 14/238,638, filed Sep. 6, 2012, entitled DIRECT METALIZATION OF ELECTRICAL CIRCUIT STRUCTURES, the entire of disclosure of which is hereby incorporated by reference.

Neck portion 66 of the terminal 62 has a first cross-sectional shape 86 and the distal portion 88 has a second cross-sectional shape 90 that is larger than the first cross-sectional shape 86. The second cross-sectional shape 90 extends beyond all edges of the first cross-sectional shape 86 creating a circumferential undercut 68. The undercut 68 may be uniform around the perimeter of the terminal 62, or offset.

Figure 1G:
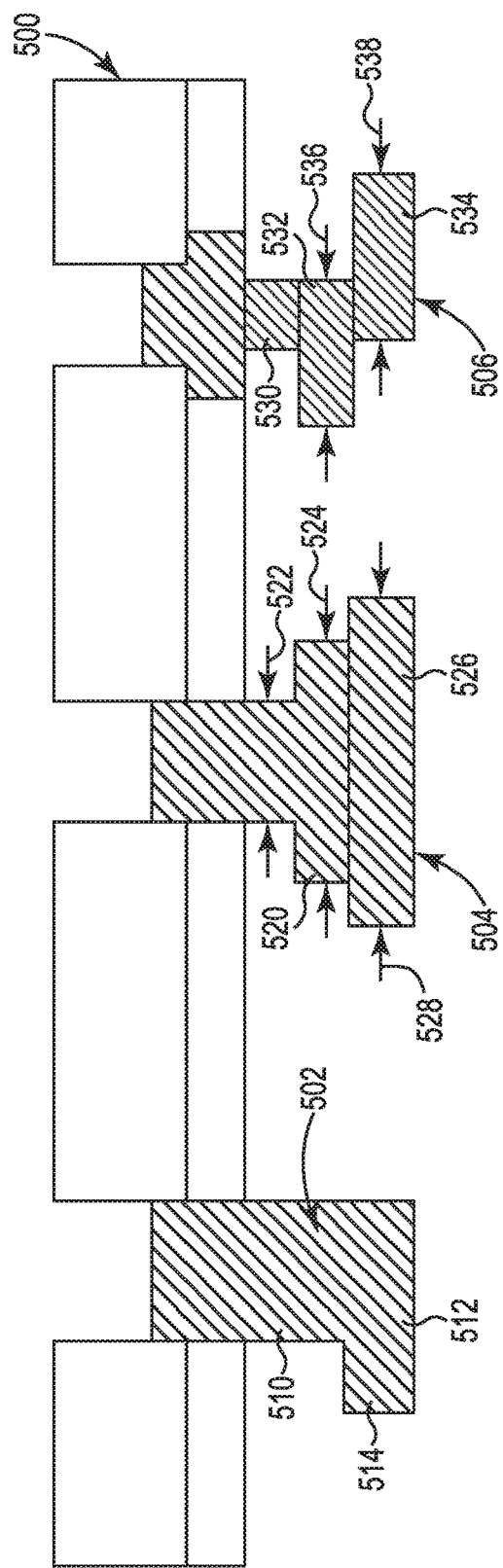

FIG. 1G illustrates some alternate electrical connector 500 with electrodeposited terminals 502, 504, 506 of various shapes in accordance with an embodiment of the present disclosure. The terminal 502 includes neck portion 510 and distal portion 512 configured with cantilevered portion 514 that extends beyond the perimeter of the neck portion 510. The cross-sectional shapes of the neck portion 510 and distal portion 512 can be the same or different. For example, the neck portion 510 can be oval shaped, while the distal portion 512 is rectangular.

Terminal 504 includes stepped structure where neck portion 520 has a first cross-sectional shape 522 and a second cross-sectional shape 524 larger than the first cross-sectional shape 522. Distal portion 526 has a third cross-sectional shape 528 larger than both the first and second cross-sectional shapes 522, 524. The cross-sectional shapes 522, 524, 528 can be the same or different.

Terminal 506 includes neck portion 530, intermediate cantilever portion 532, and distal portion 534 cantilevered in a different direction. The cross-sectional shape 536 of the intermediate cantilevered portion 532 may be the same as the cross-sectional shape 538 of the distal portion 534, just offset in different directions. Alternatively, the cross-sectional shapes 536, 538 may be different sizes or shapes.

The present method permits fine contact-to-contact spacing (pitch) on the order of less than 1.0 mm pitch, and more preferably a pitch of less than about 0.7 millimeter, and most preferably a pitch of less than about 0.4 millimeter. The present high density terminals 62 can be configured as a low cost, high signal performance electrical interconnect assembly or socket, which has a low profile that is particularly useful for desktop and mobile PC applications. IC devices can be installed and uninstalled without the need to reflow solder. The solder-free electrical connection of the IC devices is environmentally friendly. In another embodiment, the high density circuit structure can also be a portion of a socket or semiconductor package.

FIGS. 2A and 2B illustrate an application of electrical connector 100 with resist defined electroplated terminals 102 in accordance with an embodiment of the present disclosure. Base core layer 104 is processes with multiple layers of plating resist which are imaged and developed or ablated to create the resultant terminals 102, as discussed herein. Upper core 106 is processes to create a plated terminal openings 108 that are in proximity to the upper surface 110 of the terminals 102.

In one embodiment, the electrical connector 100 is mated with circuit member 112. The circuit member 112 can be a semiconductor package, bare die, rigid, flexible or hybrid rigid flexible printed circuit is mated with the upper core 106. In the illustrated embodiment, the circuit member 112 is a BGA device with solder terminals 114 positioned in the plated terminal openings 108.

The electrical connection between the solder balls 114 on the circuit member 112 and the terminals 102 can be created by reflow to create the mechanical and electrical connection. In another embodiment, the solder terminal 114 and/or the plated sidewalls 109 are plastically deformed during engagement to create electrical connection in a manner that does not require reflow of the solder terminals 114. In some embodiments, a retention lid is used to maintain loading 111 of the solder terminals 114 in the terminal openings 108. In an embodiment where the terminal openings 108 are not plated, the terminal openings 108 only provides locational positioning for the solder balls 114 and support while the solder balls 114 is reflowed and connects directly to the terminals 102. This embodiment permits for "pin like" terminal 102 to be grown in position and connected to a desired circuit member, such as for example BOA device 112.

In another embodiment, the terminals 102 can be plated with nickel and gold to create an interface conducive to mating with a socket or connector, or the terminal 102 can be reflow soldered directly to another circuit. For example, domed end 116 can be solder that is reflowed to attach the electrical connector 100 directly to another circuit member, such as for example PCB 122.

FIG. 2B is a sectional view of an alternate system for electrically coupling the terminals 102 in accordance with an embodiment of the present disclosure. In the illustrated embodiment, interconnect 120 couples the terminals 102 to second circuit member 122, such as a PCB. Spring contact members 124 are then located within interconnect housing 126. The spring contact members 124 include one or more beams 128 that are permitted to flex within the housing 126.

In the illustrated embodiment, protrusion 130 at distal ends of the beams 128 are configured to engage with the terminals 102, causing the beams 128 to flex outward in direction 132. The domed end 116 reduces the required insertion past the protrusions 130.

As best illustrated in FIG. 2B, once the terminals 102 on the circuit member 100 are fully engaged with the interconnect 120, the protrusions 130 are biased by the elastic properties of the beams 128 into engagement with neck portion 134 of the terminals 102 to create both a mechanical and electrical connection. In one embodiment, the beams 128 create bias force 136 to retain the circuit member 100 to the interconnect 120. An external fixation mechanism may also be used to secure the circuit member 100 to the interconnect 120.

Figure 3:
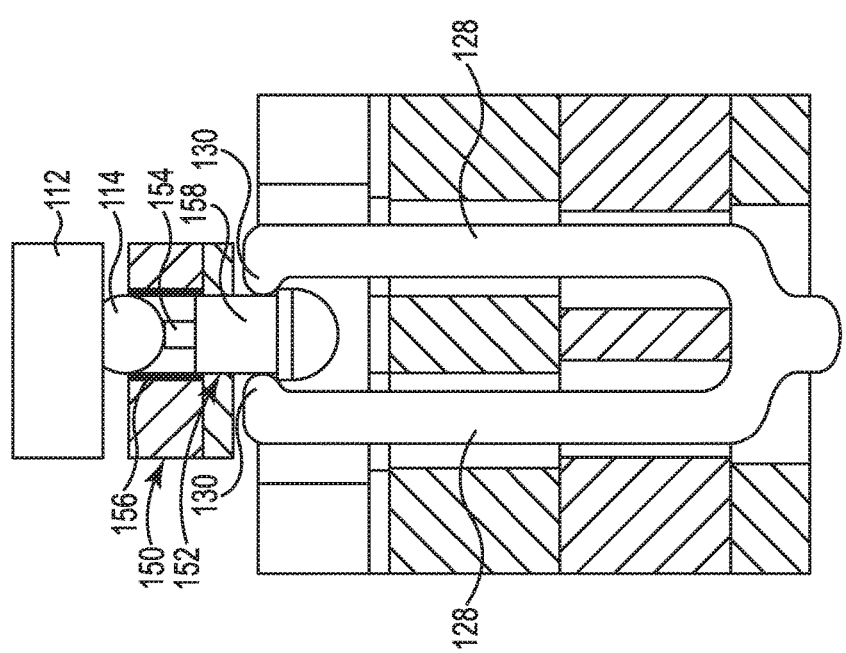
FIG. 3 is a side view of an alternate electrical interconnect with electroplated terminals coupled to a BGA device in accordance with an embodiment of the present disclosure.

FIG. 3 illustrates an alternate circuit member 150 with extension 154 attached to proximal ends of terminals 152. The extension 154 adds a connection point that facilitates electrical coupling with the solder terminals 114 on the BOA device 112. The electrical connection that can be made by reflow of the solder terminals 114, or compression or plastic deformation of the solder terminal 114. Plated side walls 156 are optional.

Figure 4A:
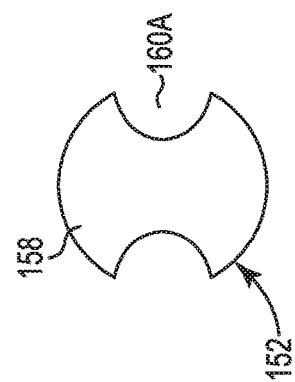
FIGS. 4A and 4B illustrate alternate neck portions for electroplated terminals in accordance with an embodiment of the present disclosure.
Figure 4B:
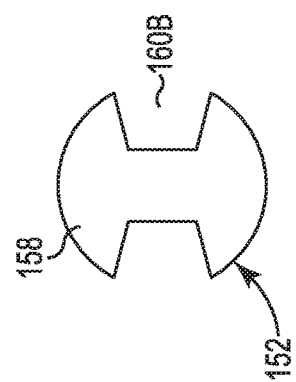

FIGS. 4A and 4B illustrate variations in the resist defined electroplated terminals 152 illustrated in FIG. 3. In particular, neck portion 158 of the terminal 152 can include recesses 160A, 160B ("160") configured to receive the protrusions 130 on the beams 128. In one embodiment, the recesses 160 have a shape complementary with the protrusions 130 on the beams 128.

FIG. 5A-5D illustrate various assemblies using electrical connectors with electroplated terminals in accordance with embodiments of the present disclosure.

Figure 5A:
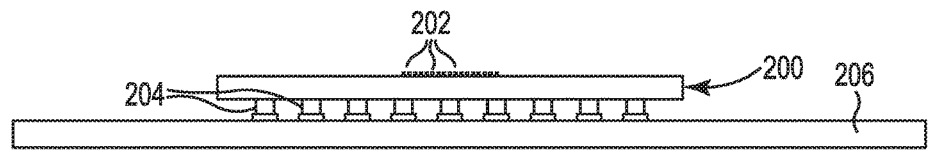
FIGS. 5A through 5D illustrate various electrical assemblies an electrical connector with resist defined electroplated terminals in accordance with an embodiment of the present disclosure.

FIG. 5A illustrates an electrical interconnector 200 configured to provide internal routing and contact distribution. Flip chip or die level terminals 202 are located on top surface and a plurality of electroplated terminals 204 extend above the bottom surface. The electroplated terminals 204 can be soldered to PCB 206 or can be electrically coupled using other techniques disclosed herein (see e.g., FIGS. 2A and 3).

Figure 5B:
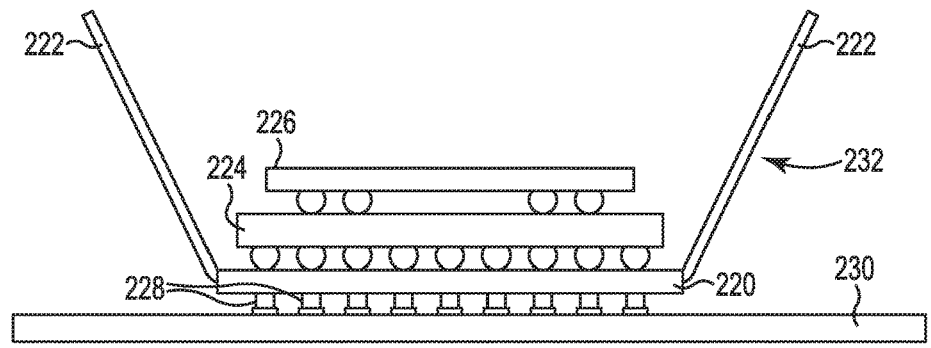

FIG. 5B illustrates an electrical interconnect 220 with routing and circuitry extensions 222 electrically coupled to multiple discrete devices 224, 226, such as for example, IC devices, packages, discrete components, connectors and probes, sensors, cameras, antennae, filters, and the like. In the illustrated embodiment, electroplated terminals 228 of the assembly 232 are electrically coupled to PCB 230.

Figure 5C:
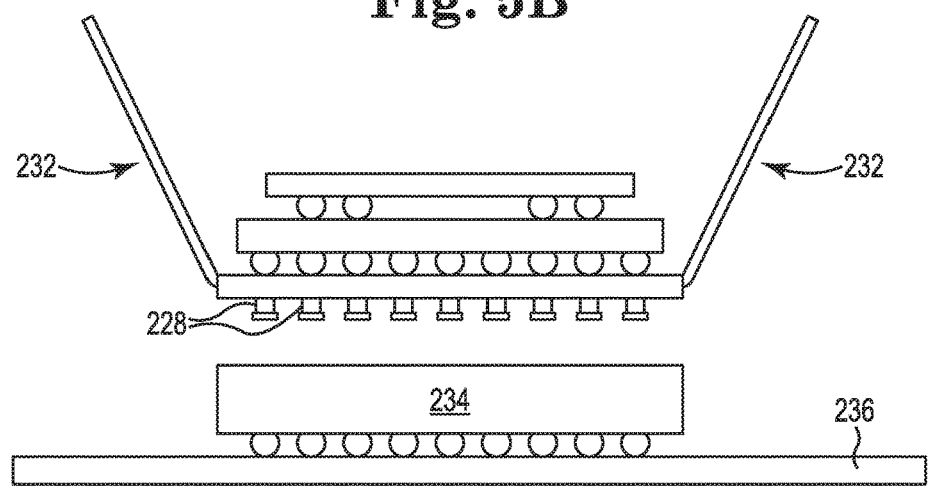

FIG. 5C illustrates the electroplated terminals 228 of the assembly 232 of FIG. 5B plugged into the socket or connector 234, such as illustrated in FIG. 3. The structure of the electroplated terminals 228 permit the assembly 232 to be removed disconnected from the socket 234. In the illustrated embodiment, the socket 234 is soldered to the PCB 236.

Figure 5D:
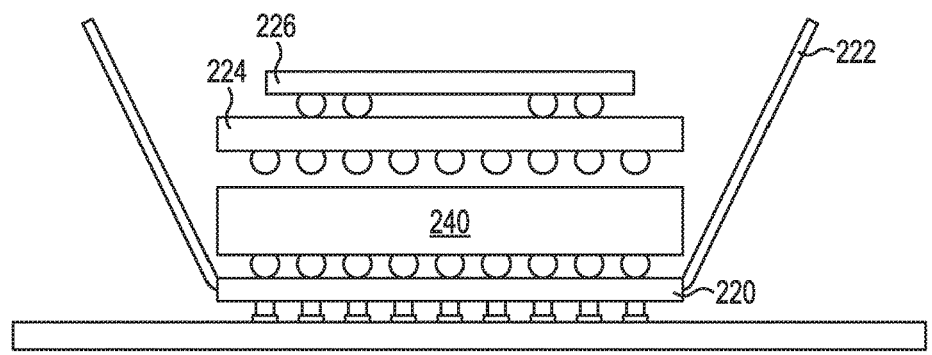

FIG. 5D illustrates a variation of the electrical interconnect 220 with routing and circuitry extensions 222 of FIG. 5B. Internal connector or socket 240 is electrically coupled to the electrical interconnect 220. The discrete devices 224, 226 are then coupled to the socket 240.

Figure 6A:
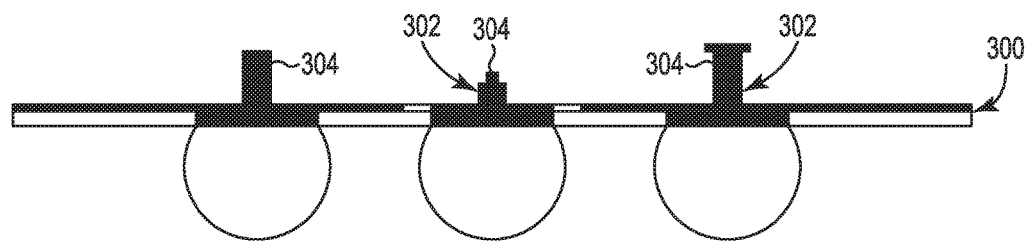
FIGS. 6A and 6B illustrate an electrical connector with resist defined electroplated terminals coupled to a flexible circuit member in accordance with an embodiment of the present disclosure.
Figure 6B:
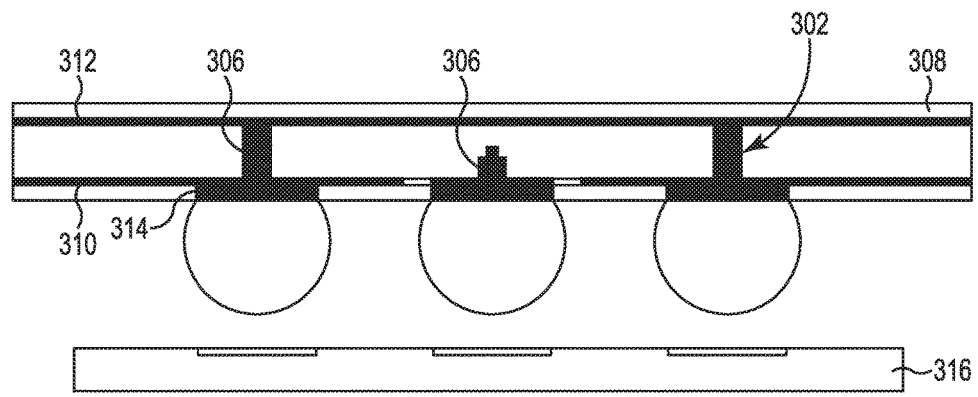

FIGS. 6A and 6B illustrate an electrical interconnect 300 with electroplated terminals 302 to create a flex-to-PCB connection in accordance with an embodiment of the present disclosure. The dielectric layer 72 of FIG. 1F is omitted or reduced in thickness so upper extensions 304 of the electroplated terminals 302 extend above the interconnect 300. The upper extensions 304 are received in recesses 306 in flexible circuit 308 and electrically coupled with conductive traces 310, 312. The lower ends 314 of the electroplated terminals 302 are soldered to PCB 316. In an alternate embodiment, the electrical interconnect 300 can be used as a mating match to a board to board or mezzanine connector, a backplane, or a processor connector.

Figure 7:
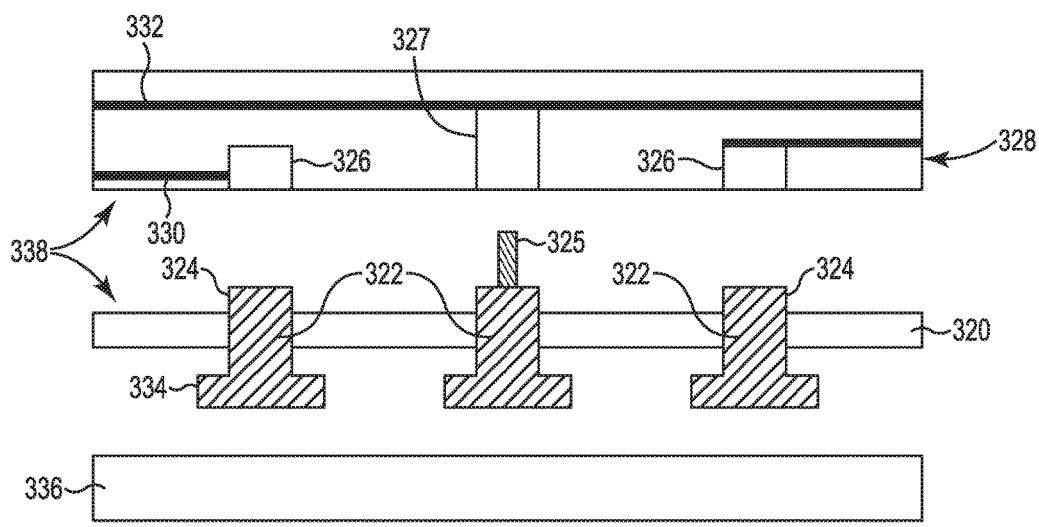
FIG. 7 illustrate an alternate electrical connector with resist defined electroplated terminals coupled to a flexible circuit member in accordance with an embodiment of the present disclosure.

FIG. 7 illustrates an alternate electrical interconnect 320 with electroplated terminals 322 to create a flex-to-PCB connection in accordance with an embodiment of the present disclosure. Proximal ends 324 of the terminals 322 are received in recesses 326 and electrically couple with circuit trace 330. Upper extensions 325 of the electroplated terminals 322 are received in recesses 327 in flexible circuit 328 and electrically coupled with conductive trace 332. The lower ends 334 of the electroplated terminals 322 are configured to snap-fit with circuit member 336, such as illustrated in FIGS. 2B, and 3, permitting the assembly 338 to be removed from the circuit member 336. In one embodiment, the flexible circuit 328 is constructed from a liquid crystal polymer material that when heated and/or pressure is applied will flow around the proximal ends 324 and upper extensions 325 of the electroplated terminals 322.

Figure 8:
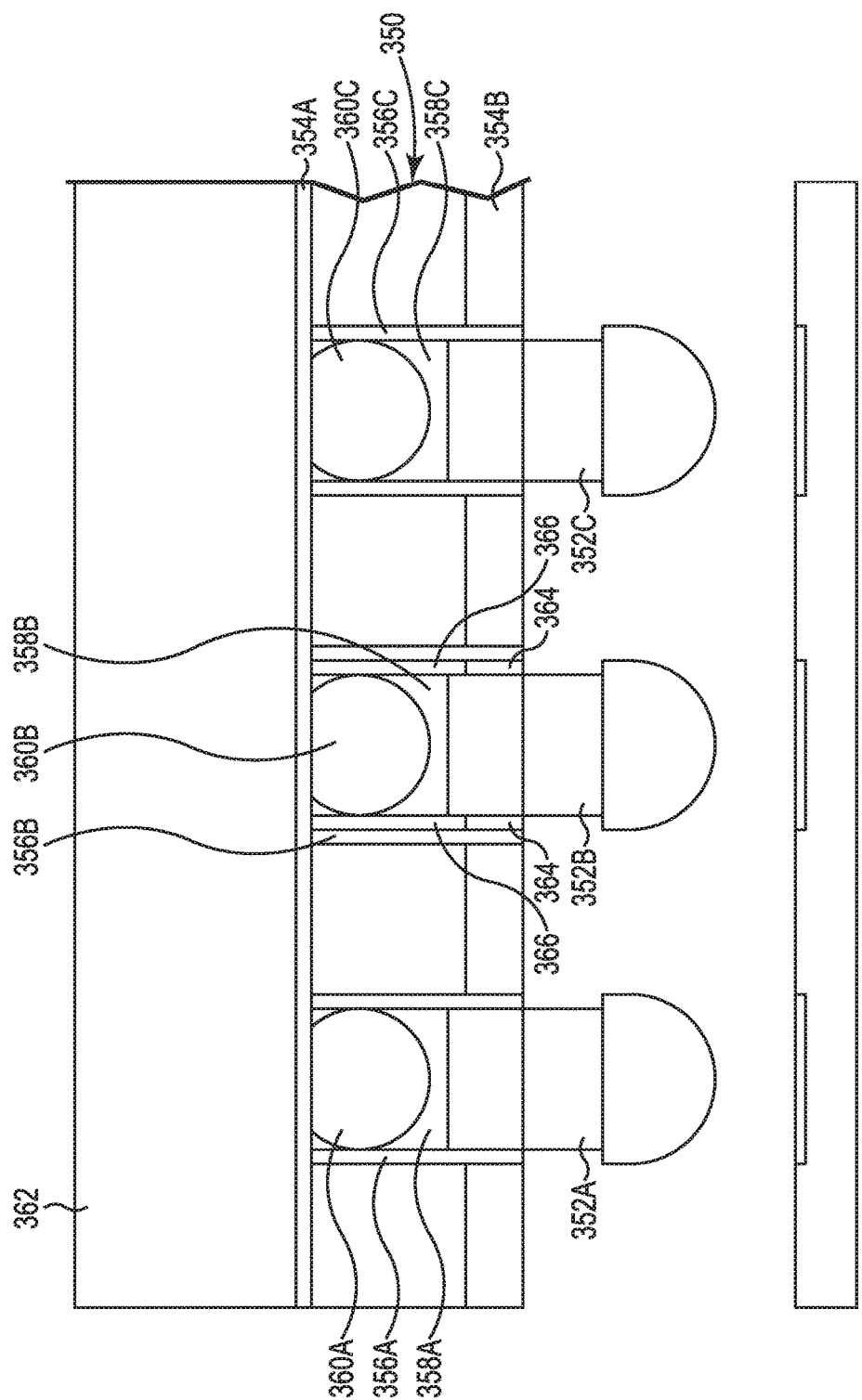
FIG. 8 is a side view of an electrical interconnect with electroplated terminals and internal ground planes coupled to a BGA device in accordance with an embodiment of the present disclosure.

FIG. 8 illustrates an electrical interconnect 350 with electroplated terminals 352A, 352B, 352C ("352") with integral shielding in accordance with an embodiment of the present disclosure. The electrical interconnect 350 includes ground planes 354A, 354B ("354") electrically coupled to plated sidewalls 356A, 356B, 356C ("356") of the terminal openings 358A, 358B, 358C ("358") that receive the solder terminals 360A, 360B, 360C ("360") on the circuit device 362. In the illustrated embodiment, the circuit device 362 is a BOA device.

In the illustrated embodiment, electroplated terminals 352A and 352C are electrically coupled to the ground planes 354. Insulation 364 isolates the electroplated terminal 352B from the ground planes 354 and the plated sidewalls 356B, creating a coaxial structure. Alternate embodiments for creating style coaxial structures are disclosed in commonly assigned U.S. patent application Ser. No. 14/408,338 entitled SEMICONDUCTOR SOCKET WITH DIRECT SELECTIVE METALIZATION, FILED Mar. 14, 2013, which is hereby incorporated by reference.

All of the plated sidewalls 356 are coupled to the ground planes 354. The plated sidewalls 356A, 356C are electrically coupled to the solder terminals 360A, 360C, so that those solder terminals 360A, 360C are tied to ground. The plated sidewalls 356B, however, are not coupled to the solder terminals 360B. Rather, the solder terminal 360B is isolated from the plated sidewalls 356B by insulation 366. The insulation 366 can be a dielectric material or simply air. The embodiment of FIG. 8 can be used for a variety of applications, including IC device-to-PCB, PCB-to-PCB, flex-to-PCB, or cable-to-PCB interface. Alternate embodiments of the present connector/interconnect with electroplated terminals are disclosed in U.S. patent Ser. No. 14/408,039, entitled HIGH SPEED CIRCUIT ASSEMBLY WITH INTEGRAL TERMINAL AND MATING BIAS LOADING ELECTRICAL CONNECTOR ASSEMBLY, which is hereby incorporated by reference.

Figure 9:
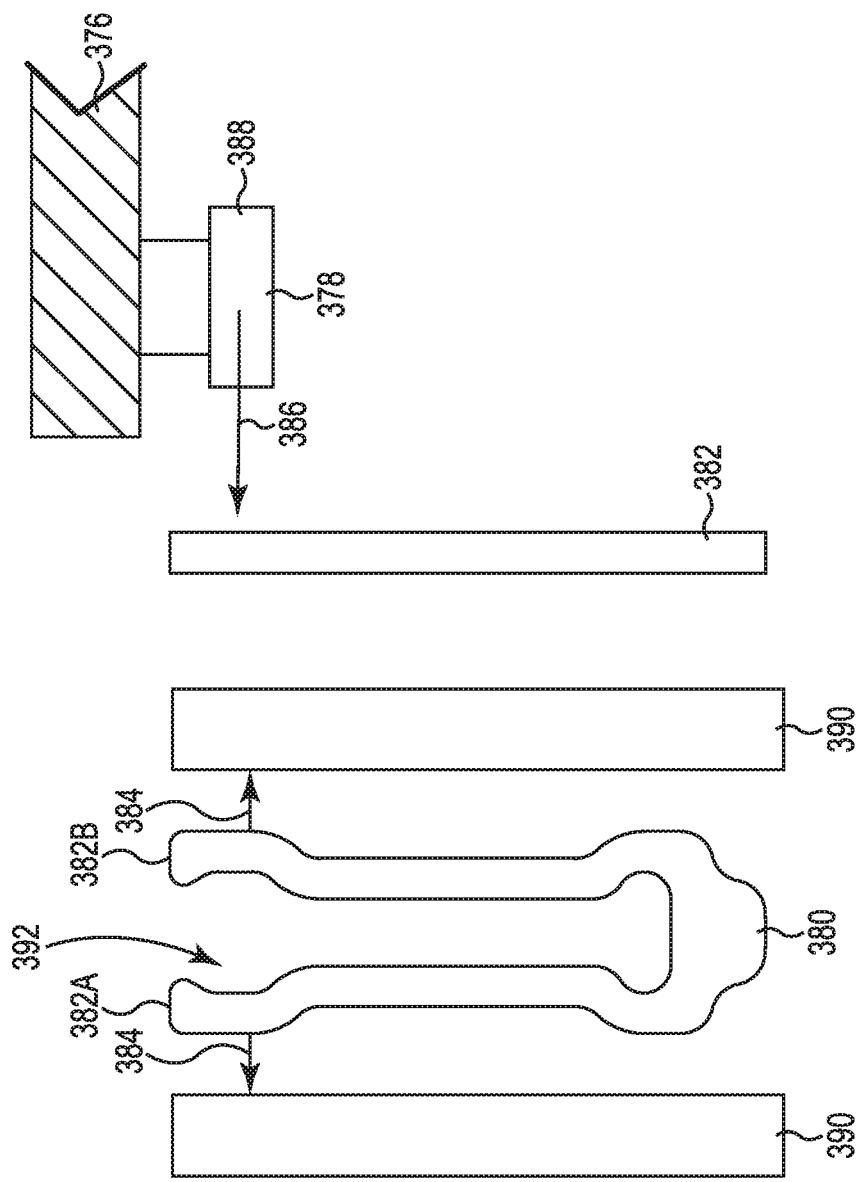
FIG. 9 illustrates an alternate way to coupled electroplated terminals to contact members in accordance with an embodiment of the present disclosure.

FIG. 9 illustrates an embodiment for forming a snap-fit coupling with the electroplated terminals 378 in accordance with an embodiment of the present disclosure. Spring contact members 380 include a pair of opposing beams 382A, 382B that flex outward 384 as terminals 378 are brought into engagement in direction 386. Distal portions 388 of the terminals 378 preferably have a circular cross sectional shape that facilitates engagement.

The circuit member 376 is moved in the direction 386 until it engages with connector housing 390. In one embodiment, space 392 between the connector housing 390 and the terminals 378 is slightly greater than radius of the distal portion 388 of the terminals 378 so the beams 382 are continually biases against the terminals 378. In another embodiment, once the terminals 378 are in the space 392, the beams 382 close to form a compressive engagement with the terminals 378.

Figure 10:
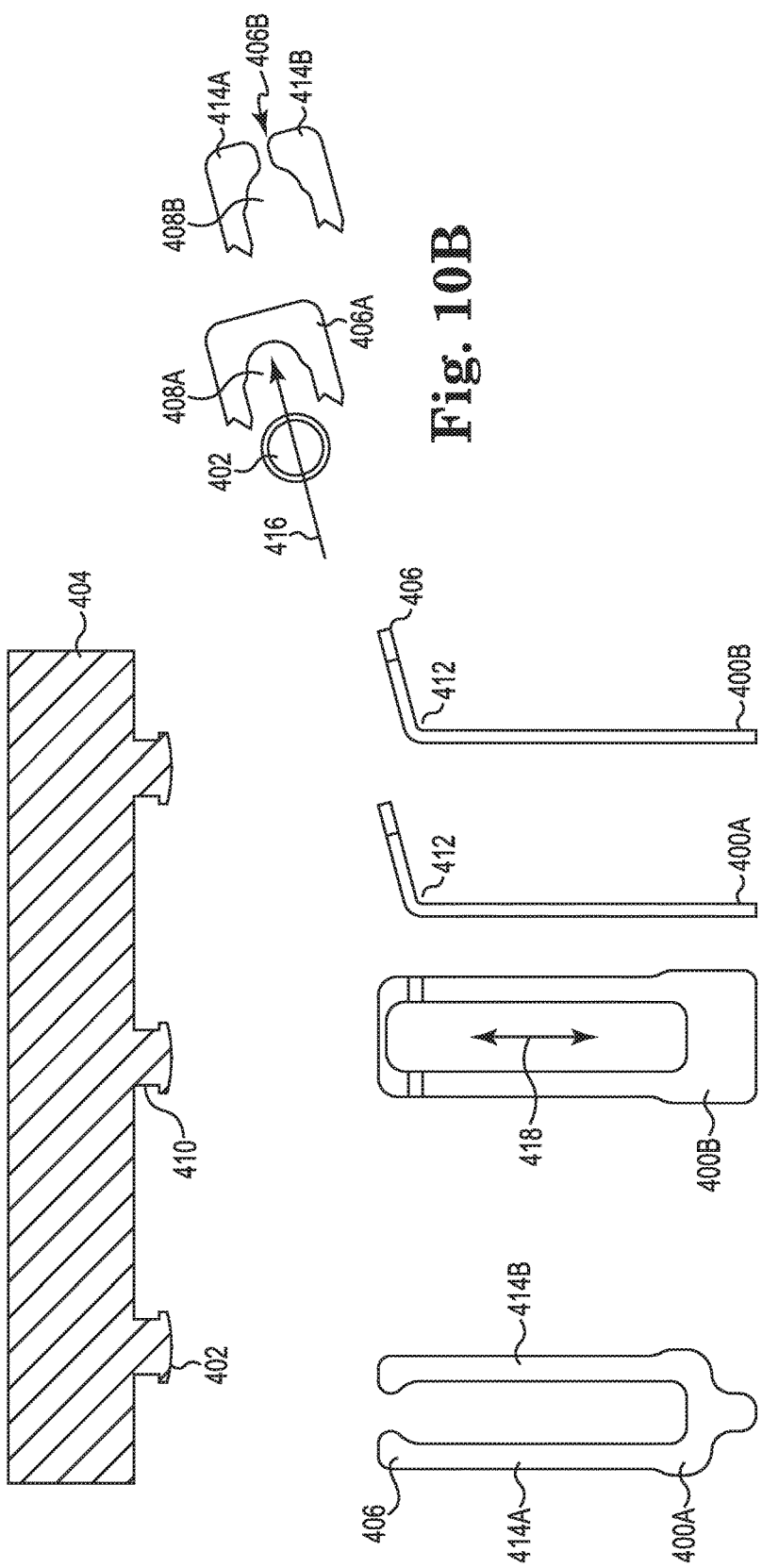
FIGS. 10A and 10B illustrate alternate way to coupled electroplated terminals to contact members in accordance with an embodiment of the present disclosure.

FIGS. 10A and 10B illustrate alternate engagement mechanisms between contact members 400A, 400B ("400") and terminals 402 on first circuit member 404 in accordance with an embodiment of the present disclosure. Distal portions 406A, 406B ("406") of the contacts members 400 are configured to engage with the terminals 402. In the illustrated embodiment, openings 408A, 408B ("408") have shapes complementary to neck portions 410 of the terminals 402. In one embodiment, distal portion 406B of contact member 400B is formed from two discrete beams 414A, 414B that can flex outward during engagement with the terminals 402.

Bends 412 near the distal portions 406 permit the terminals 402 to slide into engagement along axis 416 that is generally perpendicular to primary axis 418 of the contact members 400. Lateral or biasing loads can optionally be provided for low insertion force applications. An external mechanism can be used to maintain contact load 416 or engagement between the terminals 402 and the contact members 400 such that the terminals 402 are held by the contacts 400. Other suitable engagement mechanisms are disclosed in U.S. Pat. No. 9,196,980 (Rathbum) and U.S. Pat. No. 9,093,767 (Rathburn), which are hereby incorporated by reference.

In another embodiment, the terminals 402 are forced into engagement with the contact members 400 with a lateral or biasing load in a zero insertion force mechanism with an external feature maintaining contact load 416 against the contact members 400 in a normally open environment, or the mechanism releases pre-loaded contact members 400 such that they engage with the terminals 402 in a normally closed environment. The terminals 402 can be installed and engaged in an environment containing each of the loading mechanisms described (normal force snap retention, LIF, ZIF etc.).

Figure 11:
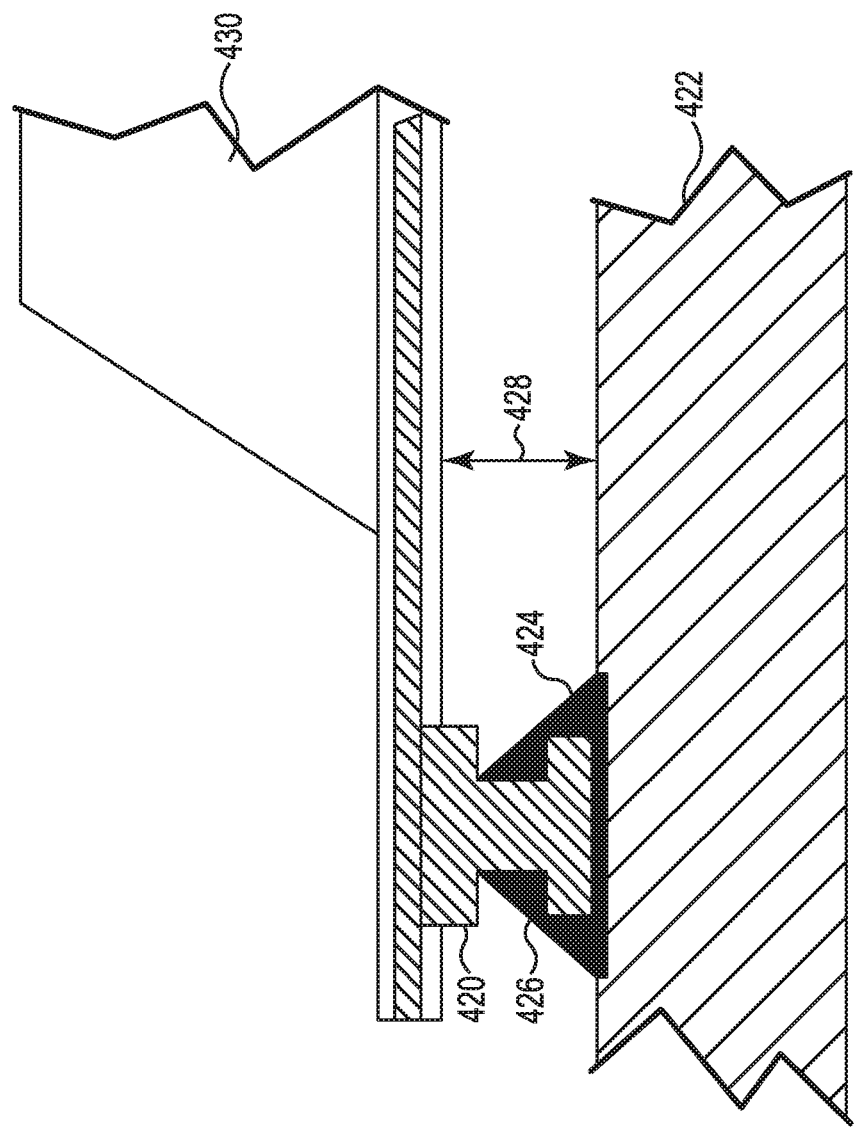
FIG. 11 is a cross sectional view of an electroplated terminal soldered to a circuit member in accordance with an embodiment of the present disclosure.

FIG. 11 illustrates an embodiment in which terminals 420 are soldered to PCB 422 in accordance with an embodiment of the present disclosure. Solder 424 wicks around the terminals 420 during reflow and engages with undercuts 426 to create an extremely strong joint. The present integral terminals 420 with undercuts 426 creates a joint much stronger than the conventional BGA solder ball BGA solder ball joints often require under fill to survive thermal or mechanical shock, not required in the illustrated embodiment because the integral terminals 420 provide a natural controlled height standoff 428. The neck region 426 of the terminals 420 provides a natural level of compliance as the ductile copper can provide some level of decoupling between the terminal 420, the circuit member 430 (such as an IC package) and the system board 422 to reduce the failure effects of thermal expansion coefficient disparities as well as mechanical stress of shock.

Figure 12:
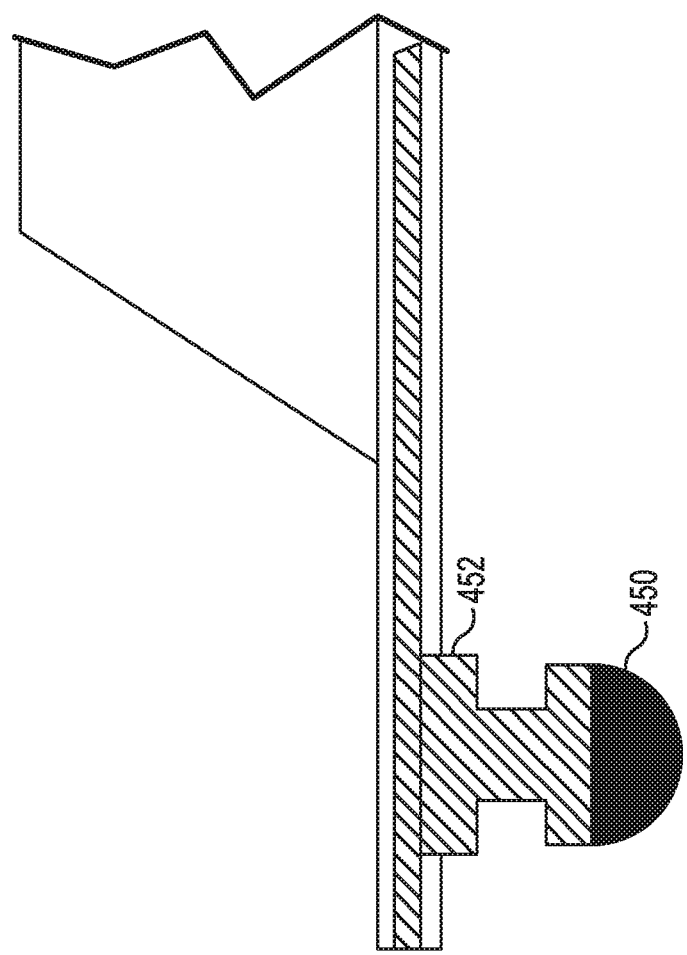
FIG. 12 illustrates solder deposited on a distal end of an electroplated terminal in accordance with an embodiment of the present disclosure.

FIG. 12 illustrates a solder deposit 450 on the terminals 452 in accordance with an embodiment of the present disclosure. In the illustrated embodiment, the terminals 452 are tin plated and are capped with solder 450 in a manner similar to methods used for copper pillar die attach which has become popular for high pin count area array devices as an alternative to flip chip or C4 attachment. The advantage of the present approach is that flip chip and C4 attachments are limited in pitch due to the potential for solder bridging of conventional solder balls as the spacing between them during reflow is reduced.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. An electrical assembly comprising:
    an electrical connector comprising;
        a substrate with a plurality of openings corresponding to a desired arrangement of electrodeposited terminals;
        electrodeposited terminals located in the openings in the substrate, the electrodeposited terminals comprising neck portions with a first cross-sectional shape and distal portions having a second cross-sectional shape larger than the first cross sectional shape, wherein the distal portions and at least a portion of the neck portions are attached to, and extend above, a first surface of the substrate to create free standing electrodeposited terminals, the distal portions include cantilevered portions that extend beyond the neck portions that create undercuts located between the distal portions and the first surface of the substrate;
        a dielectric material located on a second surface of the substrate with terminal openings aligned with proximal portions of the electrodeposited terminals;
    a first circuit member with electrical terminals positioned in the terminal openings and electrically coupled to the proximal portions of the electrodeposited terminals; and
    a second circuit member electrically coupled to the distal ends of the electrodeposited terminals, wherein the second circuit member comprises an interconnect having spring contact members located in openings, wherein protrusions on the spring contact members form a compressive engagement with the neck portions of the electrodeposited terminals.

2. The assembly of claim 1 wherein inside surfaces of the terminal openings are plated.

3. The assembly of claim 2 wherein the first circuit member comprises a BGA device with solder terminals electrically coupled with the plating in the terminal openings.

4. The assembly of claim 3 wherein at least one of the solder terminals on the BGA device and the plating in the terminal openings are plastically deformed in order to electrically couple the solder terminals to the electrodeposited terminals.

5. The assembly of claim 1 wherein the first circuit member is a BGA device with solder terminals reflowed to electrically couple to the electrodeposited terminals.

6. The assembly of claim 1 wherein one or more of the substrate retaining the electroplated terminals or the dielectric material on the second surface of the substrate comprises a liquid crystal polymer.

7. The assembly of claim 1 wherein one or more of the substrate retaining the electroplated terminals or the dielectric material on the second surface of the substrate comprises a flexible circuit member.

8. The assembly of claim 1 wherein one or more of the substrate retaining the electroplated terminals or the dielectric material on the second surface of the substrate comprises at least one circuit traces electrically coupling at least two of the electrodeposited terminals.

9. The assembly of claim 1 wherein the dielectric material on the second surface of the substrate comprises a flexible circuit member with a plurality of recesses that receive proximal portions of the electrodeposited terminals.

10. The assembly of claim 1 wherein the distal portions of the electrodeposited terminals comprise two cantilevered portions that extend beyond the neck portions in different directions relative to the neck portion.

11. The assembly of claim 1 comprising at least one extension electrodeposited on a proximal end of an electrodeposited terminal configured to engage with the electrical terminals on the first circuit member.

12. The assembly of claim 1 wherein compressive engagement of the spring contact members with the neck portion of the electrodeposited terminals forms a snap-fit coupling that retains the second circuit member in engagement with the electrical connector.

13. The assembly of claim 1 wherein the second circuit member comprises contact members with openings having shapes complementary to neck portions of the electroplated terminals.

14. The assembly of claim 1 wherein the second circuit member comprises contact members that slide into engagement with the neck portions of the electroplated terminals.

15. The assembly of claim 1 wherein the second circuit member comprises contact members that provide a zero insertion force or low insertion force engagement with the neck portions of the electroplated terminals.

16. The assembly of claim 15 comprising a lateral load generally parallel to the first surface of the substrate retaining the electrodeposited terminals maintains engagement with the contact members on the second circuit member.

17. An electrical assembly comprising:
an electrical connector comprising;
a substrate with a plurality of openings corresponding to a desired arrangement of electrodeposited terminals;
electrodeposited terminals located in the openings in the substrate, the electrodeposited terminals comprising neck portions with a first cross-sectional shape and distal portions having a second cross-sectional shape larger than the first cross sectional shape, wherein the distal portions and at least a portion of the neck portions are attached to, and extend above, a first surface of the substrate to create free standing electrodeposited terminals, the distal portions include cantilevered portions that extend beyond the neck portions that create undercuts located between the distal portions and the first surface of the substrate;
a first circuit member comprising a flexible circuit member located on a second surface of the substrate with a plurality of terminal openings aligned to receive proximal portions of the electrodeposited terminals, the flexible circuit member including a plurality of circuit traces electrically coupled to the electrodeposited terminals; and
a second circuit member electrically coupled to the distal ends of the electrodeposited terminals, wherein the second circuit member comprises contact members that provide a zero insertion force or low insertion force engagement with the neck portions of the electroplated terminals.

18. The assembly of claim 17 wherein the substrate retaining the electroplated terminals comprises at least one circuit traces electrically coupling at least two of the electrodeposited terminals.

19. The assembly of claim 17 wherein one or more of the substrate retaining the electroplated terminals or the flexible circuit member comprises a liquid crystal polymer.

20. An electrical assembly comprising:
an electrical connector comprising;
a substrate with a plurality of openings corresponding to a desired arrangement of electrodeposited terminals;
electrodeposited terminals located in the openings in the substrate, the electrodeposited terminals comprising neck portions with a first cross-sectional shape and distal portions having a second cross-sectional shape larger than the first cross sectional shape, wherein the distal portions and at least a portion of the neck portions are attached to, and extend above, a first surface of the substrate to create free standing electrodeposited terminals, the distal portions include cantilevered portions that extend beyond the neck portions that create undercuts located between the distal portions and the first surface of the substrate;
a dielectric material located on a second surface of the substrate with terminal openings aligned with proximal portions of the electrodeposited terminals;
a first circuit member with electrical terminals positioned in the terminal openings and electrically coupled to the proximal portions of the electrodeposited terminals; and
a second circuit member electrically coupled to the distal ends of the electrodeposited terminals, wherein the second circuit member comprises contact members that provide a zero-insertion force or low insertion force engagement with the neck portions of the electroplated terminals.

* * * * *